(12) United States Patent
Garwood et al.

(10) Patent No.: US 6,650,116 B2
(45) Date of Patent: Nov. 18, 2003

(54) METHOD AND SYSTEM FOR NMR USING ADIABATIC RF PULSES PRODUCING SPATIALLY QUADRATIC PHASE

(75) Inventors: Michael G. Garwood, Medina, MN (US); Kamil Ugurbil, Minneapolis, MN (US); Lance DeLaBarre, St. Anthony, MN (US); Patrick Bolan, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 09/961,502

(22) Filed: Sep. 24, 2001

(65) Prior Publication Data

US 2002/0153889 A1 Oct. 24, 2002

Related U.S. Application Data

(60) Provisional application No. 60/285,267, filed on Apr. 20, 2001.

(51) Int. Cl.[7] .................................................. G01V 3/00
(52) U.S. Cl. ........................ 324/309; 324/307; 324/300
(58) Field of Search .................. 324/300, 309, 324/307, 306, 303, 302, 318

(56) References Cited

U.S. PATENT DOCUMENTS

| | | | |
|---|---|---|---|
| 4,639,671 A | 1/1987 | Macovski | |
| 5,057,776 A | 10/1991 | Macovski | ................... 324/309 |
| 5,180,981 A | 1/1993 | Purdy | |
| 5,245,282 A | 9/1993 | Mugler, III et al. | ........ 324/309 |
| 5,274,331 A | 12/1993 | Macovski | ................... 324/309 |
| 5,736,958 A | 4/1998 | Turpin | |
| 5,751,243 A | 5/1998 | Turpin | |
| 5,821,752 A | 10/1998 | LeRoux | |
| 5,827,187 A | 10/1998 | Wang et al. | ................. 600/419 |
| 6,043,654 A | 3/2000 | Liu et al. | |
| 6,066,949 A | 5/2000 | Alley et al. | |
| 6,166,541 A | * 12/2000 | Smith et al. | ................. 324/300 |
| 6,268,728 B1 | 7/2001 | Morrell | ....................... 324/307 |

OTHER PUBLICATIONS

Devoulon, P., et al., "Profiles in Magnetic Resonance Imaging", *MRM 31*, 178–183, (1994).

Henning, J., "Chemical Shift Imaging with Phase–Encoding RF Pulses", *Magnetic Resonance in Medicine 25*, 289–298, (1992).

Johnson, G., et al., "Optimized Phase Scrambling for RF Phase Encoding", *Journal of Magnetic Resonance, Series B 103*, 59–63, (1994).

(List continued on next page.)

*Primary Examiner*—Edward Lefkowitz
*Assistant Examiner*—Tiffany A. Fetzner
(74) *Attorney, Agent, or Firm*—Schwegman, Lundberg, Woessner & Kluth, P.A.

(57) ABSTRACT

A method and system for performing MRI and NMR spectroscopy that improves the dynamic range of the received signal by using adiabatic RF pulses for spin excitation rather than for spin inversion. The preferred adiabatic RF excitation produces a spatially varying phase across the slab, and a sharp slab profile. The phase variation is divided up by a phase-encoding gradient into voxels having a phase variation that is negligible over the width of the voxel. The phase variation in the slab-select direction is, on the whole, large enough that the peak amplitude of the received signal is reduced and the signal width broadened. This reduces the dynamic range required of the analog to digital converter used in a NMR system. A NMR system suitable for carrying out the methods of the invention is also disclosed.

30 Claims, 13 Drawing Sheets

OTHER PUBLICATIONS

Kunz, D., "Frequencey–Modulated Radiofrequency Pulses in Spin–Echo and Stimulated–Echo Experiments", *Magnetic Resonance in Medicine 4*, 129–136, (1987).

Maudsley, A.A., "Dynamic Range Improvement in NMR Imaging Using Phase Scrambling", *Journal of Magnetic Resonance 76*, 287–305, (1988).

Mugler, J.P., et al., "Optimized Single–Slab Three–dimensional Spin–Echo MR Imaging of the Brain", *Radiology*, 891–899, (Sep. 2000).

Oh, C.H., et al., "Phase–Scrambled RF Excitation for 3D Volume–Selective Multislice NMR Imaging", *Magnetic Resonance in Medicine 28*, 290–299, (1992).

Pipe, J.G., "Spatial Encoding and Resonstruction in MRI with Quadratic Phase Profiles", *MRM 33*, 24–33, (1995).

Tannus, A., et al., "Improved Performance of Frequency–Swept Pulses Using Offset–Independent Adiabaticity", *Journal of Magnetic Resonance, Series A 120*, Article No. 0110, 133–137, (1996).

* cited by examiner

METHOD AND SYSTEM FOR NMR USING ADIABATIC RF PULSES PRODUCING SPATIALLY QUADRATIC PHASE

RELATED APPLICATION

This application claims the benefit under 35 U.S.C. 119(e) of U.S. Provisional Application Serial No. 60/285,267, filed Apr. 20, 2001.

GOVERNMENT LICENSING RIGHTS

The U.S. Government has a paid-up license in this invention and the right, in limited circumstances, to require the patent owner to license others on reasonable terms as provided for by the terms of contracts No. RR08079 and CA79732 awarded by the National Institute of Health (NIH).

FIELD OF THE INVENTION

The present invention pertains to nuclear magnetic resonance (NMR) methods and systems, and in particular to NMR spectroscopy and magnetic resonance imaging (MRI) methods and systems for improving the dynamic range of the received signal by using RF pulses that produce a spatially varying phase that is substantially quadratic.

BACKGROUND OF THE INVENTION

MRI and NMR spectroscopy each involve placing a sample to be measured (e.g., a portion of the body) in a high, uniform magnetic field (i.e., a polarizing field $B_0$ in the Z-direction). The spins of the nuclei in the sample attempt to align with the field, but precess about it in random order at their characteristic Larmor frequency. If the sample is subject to an oscillating magnetic field (usually produced by radio frequency (RF) pulses) in the X-Y plane with a frequency near the Larmor frequency, the spins are rotated or "tipped" in the X-Y plane to produce a net transverse magnetic moment. A signal is produced by the excited spins, and when the RF magnetic field ceases, the signal can be detected by a receiver coil arranged adjacent the sample. The receiver coil converts the received signal into an electrical signal, which can then be analyzed.

Depending on the nature of the RF magnetic field and how it is transmitted to and received from the sample, 2-dimensional (2-D) or 3-dimensional (3-D) MRI of a portion of the sample can be obtained. Such images can be used for diagnosing a variety of physical conditions (e.g., the presence of cancer cells). Alternatively, NMR spectra of the "chemical shift" of a substance can be measured. Background information about NMR spectroscopy and MRI can be found in the book by S. Webb, *The Physics of Medical Imaging*, Institute of Physics Publishing, Ltd., 1992.

In "slab selective" or "volume selective" imaging, a thick slice ("slab") of the sample is excited with one or more RF pulses and several gradient pulses. The gradient pulses encode spatial information. In a typical 3D image there is a readout gradient and two phase encoding gradients. This form of MRI has the advantage that the slices are contiguous, but also has the disadvantage that the signal from the entire excited slab must be collected with each scan. These large signals can overwhelm the acquisition analog-to-digital converter (ADC). In an effort to match the range of the signal with the dynamic range of the ADC so that the smallest signals are properly digitized, commonly the signal is over-amplified and then the amplitude reduced by a variable attenuator to fill the dynamic range of the ADC.

When the analog signal is converted into a digital representation, the continuous signals are transformed into discrete steps. With very large signals, an attenuation setting that reduces the peak signal so that it does not exceed the limits of the ADC can reduce the low amplitude signals to a point that they can not be sufficiently described by the discrete steps. When this occurs, fluctuations in the least significant bits of the ADC degrade the resulting image. This same problem arises in performing NMR spectroscopy where large signals are processed. For example, in performing NMR on a section of the head, the lipid signal from the subcutaneous fat is several orders of magnitude higher than the metabolite resonances from the brain.

Various techniques have been developed in an attempt to improve the dynamic range of MRI. The techniques generally involve varying the amplitude and phase (or frequency) of the RF excitation pulse so that the amplitude of the spin-response is reduced. One such technique, for example, involves using an RF pulse with a randomized phase, as described in the paper by A. Maudsley, entitled "Dynamic Range Improvement in MRI Using Phase Scrambling," *Journal of Magnetic Resonance*, 76, 287–305 (1988). Another technique involves the use of an RF pulse with a constant amplitude and a linearly varying frequency (a chirp pulse). Related techniques have been developed for NMR spectroscopy, and are referred to as "chemical shift imaging with phase-encoding RF pulses," or CSI-PP.

Many of the phase-shifting techniques developed to date for slab-selective MRI and NMR spectroscopy do indeed reduce the dynamic range of the signal. Unfortunately however, they also have the serious shortcomings that the uniformity of the passband and the sharpness of the slab-selection excitation profile, often denoted $M_{XY}$ (hereinafter, "slab profile"), are significantly reduced. This degrades the resulting MRI image or the NMR chemical-shift spectrum.

Accordingly, there is a need for systems and methods applicable to slab-selective 3-D MRI and NMR spectroscopy that reduce the peak amplitude of the received signal while also maintaining a sharp slab profile.

SUMMARY OF THE INVENTION

The present invention pertains to nuclear magnetic resonance (NMR) methods and systems, and in particular to NMR spectroscopy and MRI methods and systems for improving the dynamic range of the received signal by using RF excitation pulses with a quadratic (or substantially quadratic) phase in a direction perpendicular to the plane defined by the slab (i.e., in the slab-select direction).

A first aspect of the invention is a method of obtaining a NMR excited signal from a sample placed in a NMR system. The method includes providing an adiabatic RF excitation pulse capable of producing a sharp slab profile to a select portion of the sample (i.e., a slab), and then detecting the resultant excited signal emanating from the slab. An example RF excitation pulse suitable for use in the present invention has a hyperbolic secant (HS) amplitude modulation with a substantially quadratic phase modulation.

A second aspect of the invention includes the method of the first aspect of the invention, where the acts therein are repeated with different phase-encoding gradients until enough data points are collected to achieve a desired resolution. The excited signal data is then transformed (e.g., by discrete Fourier transform) to obtain either a 3-D MRI image of the slab or a NMR spectrum of the slab.

In a third aspect of the invention, multiple slab images formed as described briefly above are combined to form a multiple-slab 3-D MRI image.

A fourth aspect of the invention is a computer-readable medium having instructions for a computer to carry out the methods of the present invention.

A fifth aspect of the invention is a system for performing 3-D MRI or NMR spectroscopy of a slab of a sample. The apparatus includes a magnet that creates a constant magnetic field within the slab, and gradient coils capable of forming phase-encoding gradient magnetic fields within the slab. One or more RF coils are in operable communication with the slab and are capable of providing to the slab adiabatic RF excitation pulses that form a sharp slab profile and a substantially quadratic phase across the slab. The one or more RF coils also can detect an excited signal from the slab. The phase-encoding gradient magnetic fields are used to localize the excited signal within the slab, thus allowing for excited signal data to be collected across the slab.

DETAILED DESCRIPTION OF THE INVENTION

The present invention pertains to NMR methods and systems, and in particular to NMR spectroscopy and MRI methods and systems for improving the dynamic range of the received signal by using RF excitation pulses that produce a magnetization response that is spatially varying and substantially quadratic.

In the following detailed description of the embodiments of the invention, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

The NMR System

Figure 1:
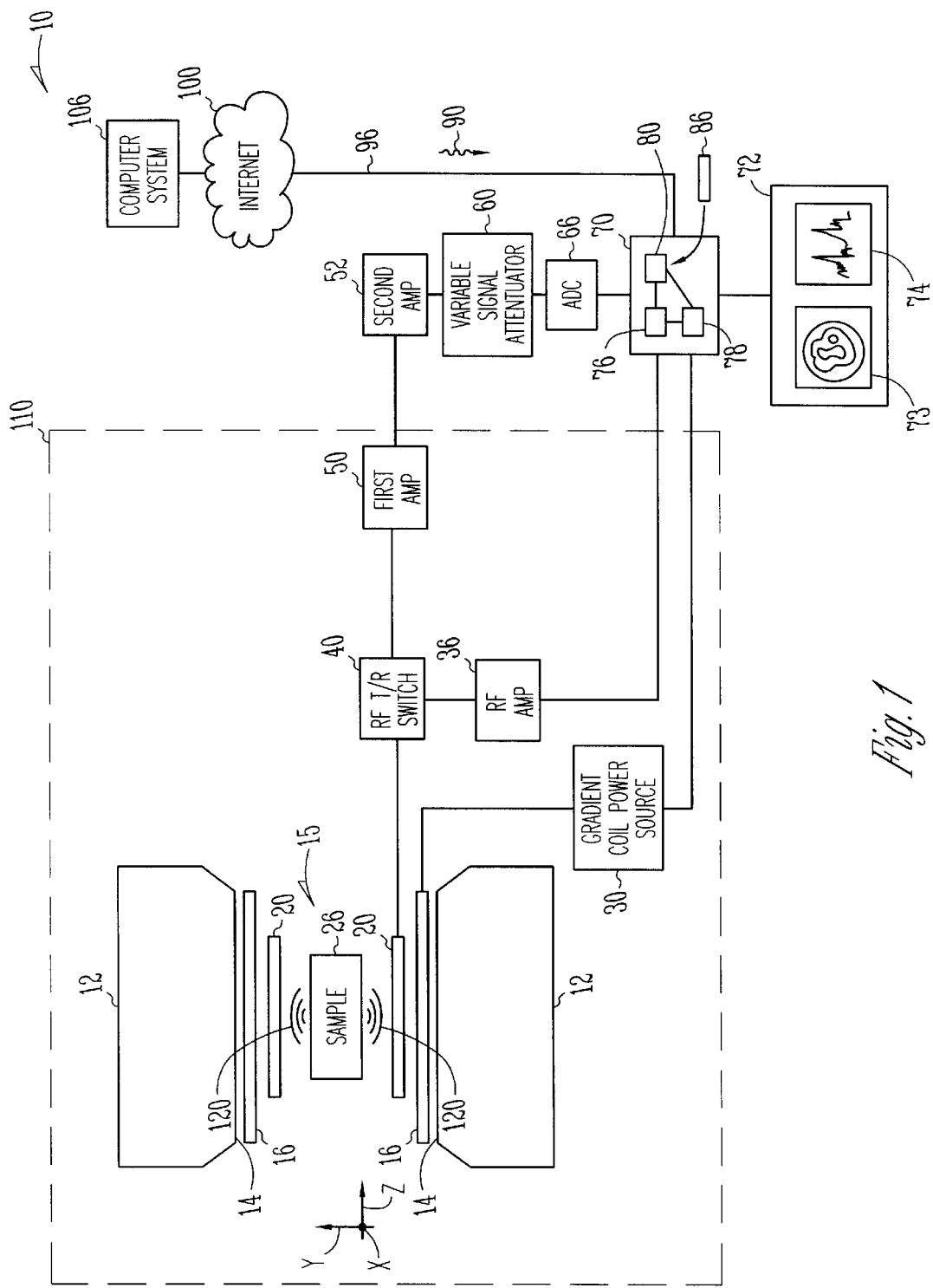
FIG. 1 is a schematic diagram of a the NMR system of the present invention.

FIG. 1 shows the essential features of an example embodiment of the NMR system 10 of the present invention. NMR system 10 is, in an example embodiment, created by adapting a commercially available NMR system, such as the Gyroscan ACS-NT 1.5 Tesla clinical MR system from Phillips, Inc., Best, The Netherlands, or the hybrid 4.0 Tesla whole-body MR system from Varian, Inc., Palo Alto, Calif. (console) and Oxford Magnet Technology, England (magnet). A NMR system suitable for being adapted to form NMR system 10 of the present invention is described in U.S. Pat. No. 5,821,752, which patent is incorporated by reference herein.

System 10 includes a strong (generally, 1T or greater) magnet 12 with an inner surface 14 defining an open volume 15. Gradient coils 16 are arranged adjacent inner surface 14, and an RF coil 20 is arranged adjacent gradient coils 16 on the side opposite the magnet. RF coil 20 is, in one example embodiment, a body coil and in another example embodiment, a surface transmit/receive coil. RF coil 20 may include one or more coils. RF coil 20 is capable of providing an RF excitation pulse to a sample 26, to be imaged or subject to NMR spectral analysis, placed in operable communication with the RF coil. The nature of the RF excitation pulse provided is a key aspect of the invention and is discussed in detail below. Sample 26 may be, for example, a section of a living organism or a material whose structure or chemical composition is to be determined.

System 10 further includes a gradient coil power source 30 electrically connected to gradient coils 16. Further included is an RF amplifier 36 electrically connected to an RF transmit/receive (T/R) switch 40, which is electrically connected to RF coil 20. T/R switch 40 allows RF coil 20 to act as both a transmitter and receiver of RF energy. Optionally, a separate receiver RF coil can detect signal emanating from the sample 26.

A first amplifier 50 is electrically connected to T/R switch 40, and an optional second amplifier 52 is electrically connected to the first amplifier. First amplifier 50 typically has a fixed amplification with a gain of ~30 dB and in an example embodiment provides the highest-quality amplification. Electrically downstream from optional second amplifier 52 is a variable signal attenuator 60, which in an example embodiment includes a series of individual signal attenuators. Signal attenuator 60 is electrically connected to an analog-to-digital converter (ADC) 66, which typically has 12 to 16 bit resolution and a dynamic range DR. ADC 66 converts the conditioned (i.e., amplified and attenuated) analog signal to a digital signal.

With continuing reference to FIG. 1, ADC 66 is electrically connected to a computer system 70, which in turn is electrically connected to a display unit 72. Display unit 72 is capable of displaying a 3-D MRI image 73 (or a portion thereof, as shown) and/or a NMR spectrum 74. Computer system 70 may be any digital or analog processing unit, such as a personal computer, workstation, a portion of a console, set top box, mainframe server, server-computer, laptop or the like capable of embodying the invention described herein. In an example embodiment, computer system 70 includes a processor 76, a memory device 78, a data storage unit 80, all electrically interconnected. Data storage control unit 80 may be, for example, a hard drive, CD-ROM drive, or a floppy disk drive that contains or is capable of accepting and reading a computer-readable medium 86. In an example embodiment, computer-readable medium is a hard disk, a CD, a floppy disk or the like. Computer-readable medium 86 contains computer-executable instructions to cause computer system 70 to perform the methods described below. A preferred computer system 70 is a workstation, such as a Sun Ultra 60, running a multi-tasking operating system, such as Unix® or VMS® or Windows NT®.

In another example embodiment, computer-readable medium 86 comprises a signal 90 traveling on a communications medium 96. In one example embodiment, signal 90 is an electrical signal and communications medium 96 is a wire, while in another example embodiment, the communications medium is an optical fiber and the signal is an optical signal. Signal 90 may, in one example, be transmitted over the Internet 100 to computer system 70 from another computer system 106.

With continuing reference to FIG. 1, in another example embodiment, system 10 includes a Faraday cage 110 (e.g., an enclosure of copper) that surrounds the portion of system 10 electrically upstream from second amplifier 52. Faraday cage 10 is designed to electromagnetically isolate the portion of system 10 enclosed therein.

Use of an Adiabatic RF Excitation Pulse

There are numerous types of RF pulses available for use in MRI and NMR spectroscopy. Certain types of pulses may be used, for example, for selectively exciting the magnetic moments of the spins (i.e., by tilting them by 90° to form magnetic moments $M_X$, $M_Y$) in order to produce an excited signal to be detected by RF coil 20 and processed as an electrical signal to form an image or obtain chemical-shift resonances. These pulses are referred to as herein as "RF excitation pulses." Other types of RF pulses are used to invert longitudinal magnetization (also referred to as "$M_Z$"), i.e., to tip the spins by 180° relative to field $B_0$, to invert spin magnetization, or to refocus the spin magnetization. The various pulse-types are typically available on NMR systems such as system 10 and are selectable from a menu displayed on display 72. RF pulse types can also be programmed into computer system 70 if they are not readily available.

It is known that certain RF pulses, called adiabatic pulses, produce excellent slab profiles when used to invert longitudinal magnetization (i.e., as "RF inversion pulses"). A certain class of adiabatic pulses, called an "offset-independent adiabatic (OIA) pulses, are described in the article by A. Tannus and M. Garwood, "Improved Performance of Frequency-Swept Pulses Using Offset-Independent Adiabaticity," *Journal of Magnetic Resonance,* Series A, 120, 133–137 (1996), which article is incorporated herein by reference. Known forms of OIA pulses, which are illustrated in FIGS. 2A and 2B, are described in the Tannus and Garwood article, and include: a Lorentz pulse (1), the hyperbolic secant (HS) pulse (2), an "HSn pulse" (3), a Gauss pulse (4), a Hanning pulse (5), a "Sin40" pulse (6), and a chirp pulse (7), the latter being the most rudimentary form of an OIA pulse.

Figure 2A:
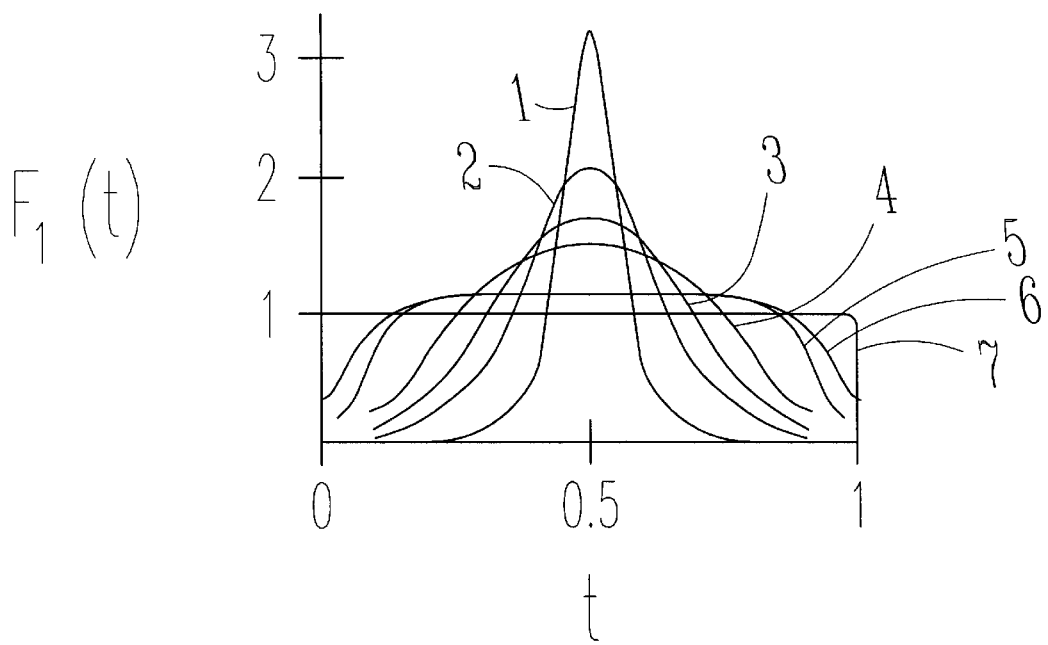
FIG. 2A plots the normalized amplitude modulation of several exemplary OIA pulses as examples of adiabatic pulses.
Figure 2B:
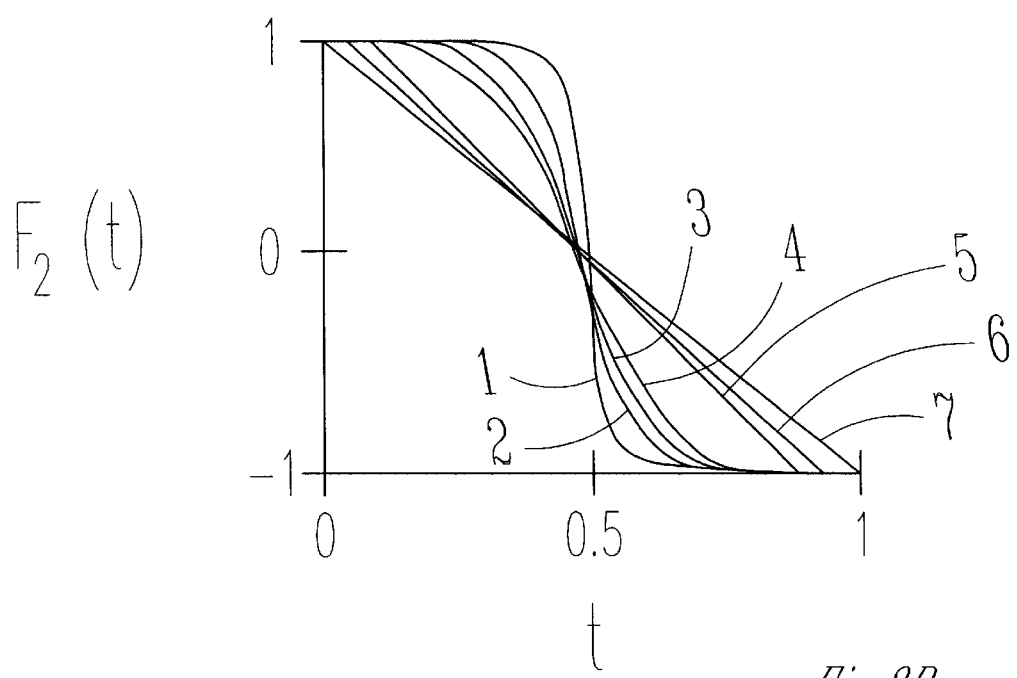
FIG. 2B plots the normalized frequency modulation corresponding to the OIA pulses of FIG. 2A.

The normalized amplitude modulation $F_1(t)$ is plotted in FIG. 2A, and the normalized frequency modulation $F_2(t)$ is plotted in FIG. 2B for the above-mentioned pulses. Phase modulation can be used in place of frequency modulation and can be derived from the frequency modulation via time-integration.

Figure 3A:
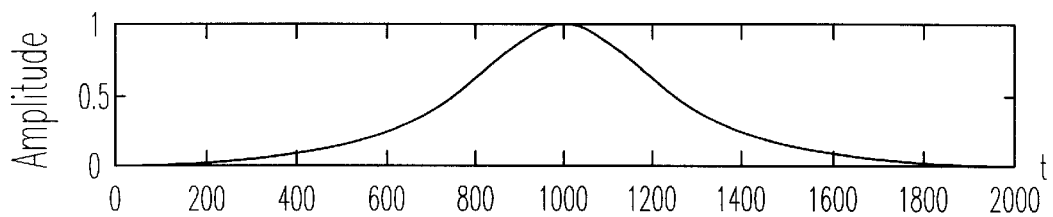
FIG. 3A is a plot of the normalized amplitude of a hyperbolic secant (HS) RF pulse as a function of time as an example embodiment of an OIA RF excitation pulse.
Figure 3B:
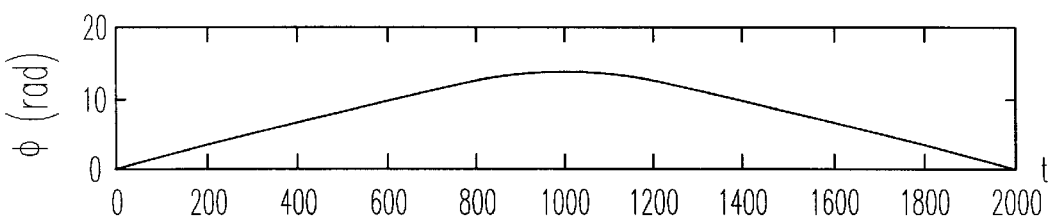
FIG. 3B is a plot of the phase modulation (in radians) of the HS pulse of FIG. 3A as a function of time.
Figure 3C:
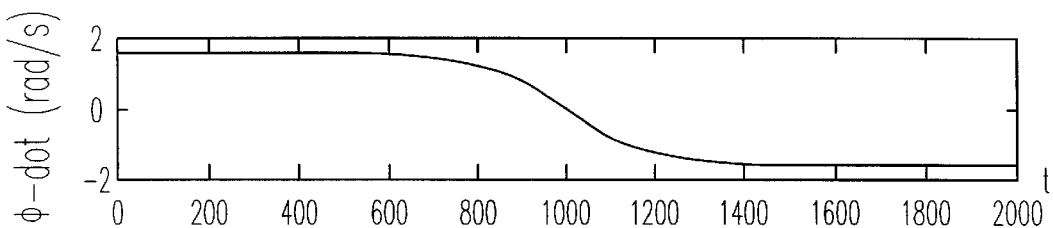
FIG. 3C is a plot of the frequency modulation (in radians/second) of the HS pulse of FIG. 3A as a function of time.

FIGS. 3A–3C plots the amplitude modulation, phase modulation and frequency modulation, respectively, for an HS pulse, which is an exemplary embodiment of an adiabatic RF excitation pulse capable of producing an excellent slab profile, as illustrated below.

Those skilled in the art will appreciate that OIA pulses represent only a small sampling of the huge number of different adiabatic pulses that are available, and that any one of a number of adiabatic pulses, including those OIA listed herein by way of example, can be created using the approach described in the Tannus and Garwood article, or by other known means.

Adiabatic type pulses have not been used effectively as an RF excitation pulse, and in fact have historically been avoided for such a purpose because they produce a substantially quadratic phase variation across the slab. Such a phase variation causes destructive interference of the signal from different portions of the slice, which results in a loss of signal and thus a poor image or a poor spectrum.

In the present invention, it has been discovered that adiabatic pulses typically only used for inverting longitudinal magnetization can be used for selective spin excitation for 3-D slab imaging and volume NMR spectroscopy.

The present invention uses adiabatic RF excitation pulses that produce a sharp slab profile, in combination with phase-encoding gradients (as a specific example) to break up the resultant magnetization phase variation into small increments in the slab-select direction so that the intra-voxel dephasing becomes small (i.e., less than 180° phase variation $\Delta\Phi$ over the voxel).

Figure 4A:
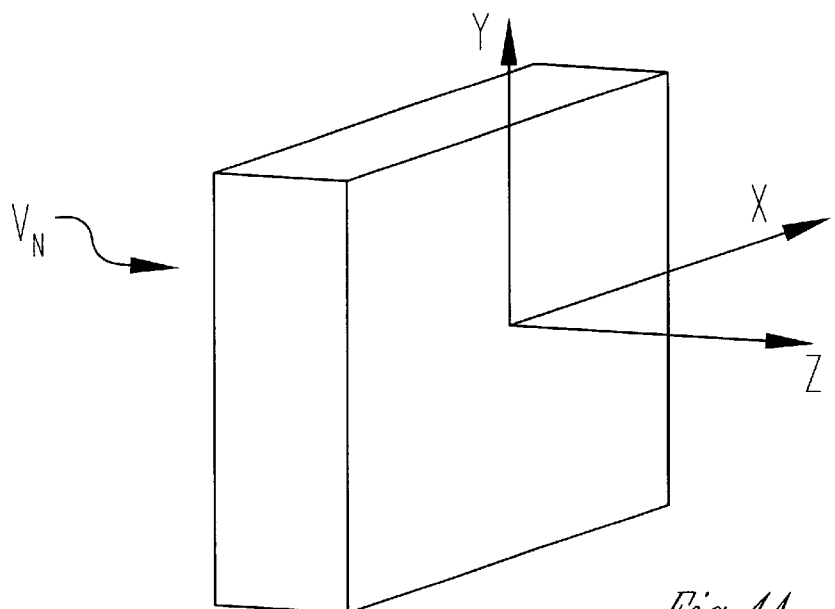
FIG. 4A is an isometric view of a single slab ($V_N$) of a sample to be subject to NMR, showing the slab-select direction as the Z-direction.
Figure 4B:
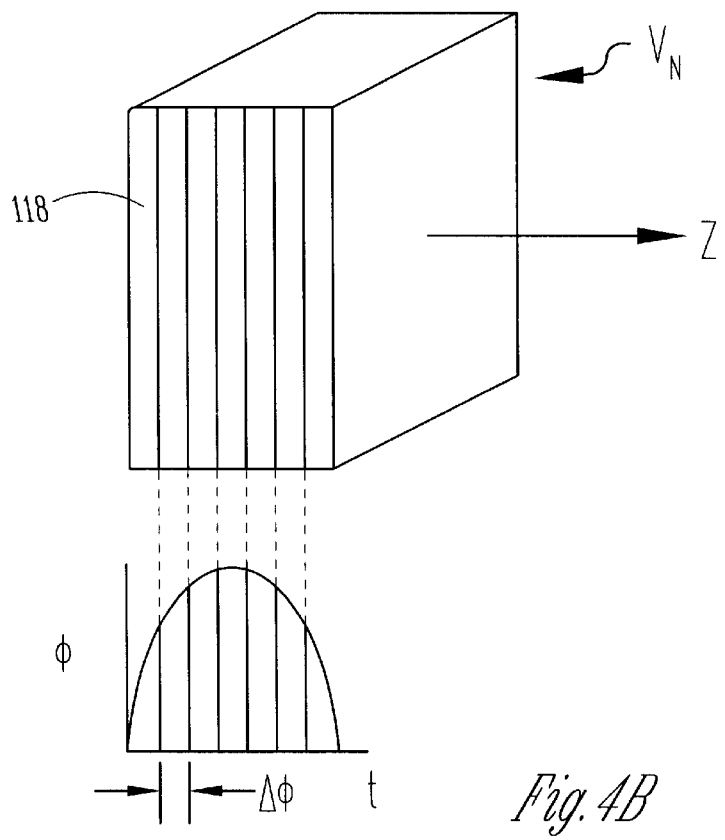
FIG. 4B is a partial isometric view of the slab of FIG. 4A, also showing the division of the slab into sections along the slab-select direction corresponding to individual voxels, along with a plot of the quadratic phase versus time associated with the adiabatic RF excitation pulse.

FIGS. 4A and 4B show, for a particular slab $V_N$, how the phase $\Phi$ is divided into voxels 118 in the slab-select direction (i.e., the Z-direction or "across the slab")) using the phase-encoding gradients. The phase $\Phi$ (which might range between 10 and 15 radians) in the slab-select direction (which typically has a dimension ranging from a few to tens of centimeters) is selected to permit increased receiver gain. This is achieved by reducing the coherence of the excited signal so that interference effects are mitigated. As a consequence, the excited signal is broadened in time and its magnitude reduced, while preserving the total amount of detected power. This, in turn, results in an improved signal-to-noise ratio (SNR), since the ADC is not "maxed out" by the high peak signal amplitude.

The adiabatic RF pulses considered for use in the present invention need to retain a desirable slab profile when used to excite transverse magnetization ($M_{xy}$) under adiabatic conditions. Certain OIA pulses satisfying the above criteria are just one specific subset of a larger family of adiabatic pulses that will produce the necessarily sharp slab profile and phase variation for the purposes of the present invention. OIA RF excitation pulses also have the advantage of being able to excite a broad bandwidth (BW) with relatively low peak RF power, as illustrated further below.

The CHIRP pulse is an example of an OIA pulse that, although producing a quadratic phase, the magnetization profile (Mxy) does not produce a sharp slab profile—i.e., the stop band is not flat, the band-pass is not smooth, and the transition (edge) of the profile is not sharp—so that the slab profile is poorly defined. The present invention encompasses those adiabatic pulses that produce a sharp excitation (slab) profile for the purpose of reducing dynamic range limits in MRI and magnetic resonance spectroscopy.

Offset-independent adiabaticity is a method of relating the amplitude modulation to the frequency modulation during pulse design, so that a constant amount of $M_{xy}$ (or inversion, $-M_z$) is obtained over the bandwidth defined by the frequency sweep range. Other means of generating adiabatic pulses with sharp profiles are known. One can, if so motivated, make an OIA RF excitation pulse that creates a slab profile with poor transition (edge) definition and features (e.g., oscillations) outside the frequency sweep range. OIA pulses will generally not make an acceptable slab profile unless a proper amplitude modulation function is used. In this regard, the square amplitude modulation function used in the CHIRP pulse would not be adequate as an RF excitation pulse in the present invention because it does not produce the sharp slab profile necessary for carrying out the present invention.

Thus, in the present invention, straightforward empirical or computer analysis of the kind readily within the capability of one skilled in the art may need to be performed to ascertain whether a particular adiabatic pulse produces a sufficiently sharp slab profile for the MRI imaging or NMR spectroscopy application at hand.

FIGS. 5A–5F are plots of the simulated signal intensity response (i.e., slab profile) as a function of position in the slab-select direction for the ITS RF excitation pulse (FIGS. 3A–3C). The solid line indicates the magnitude of the excited spins. The dashed line indicates the simulated signal intensity after taking into account that phase variations across individual voxels will dephase magnetization It can be seen that as the number of phase encoding steps increases from 4 to 128, thus decreasing the phase variation across each voxel, the simulated signal intensity (dashed line) more closely resembles the magnitude of the excited spins (solid line). Such simulation can readily be performed for any adiabatic pulse to be considered as an RF excitation pulse for the resent invention as illustrated immediately below.

Figure 5A:
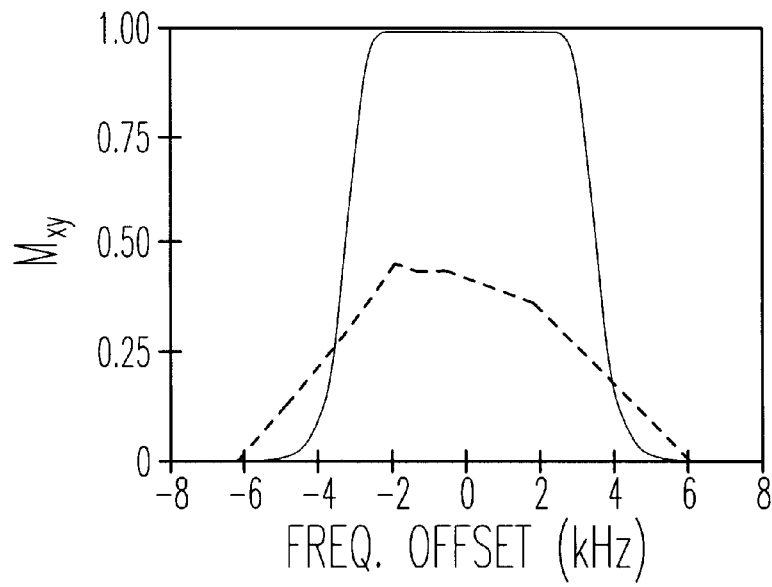
FIGS. 5A–F are plots of the magnitude of the excited spins (i.e., slab profile) (solid line) along with the simulated intensity signal (dashed line) for a HR RF excitation pulse, wherein the number of phase-encoding steps is 4, 8, 16, 32, 64 and 128, respectively.
Figure 5B:
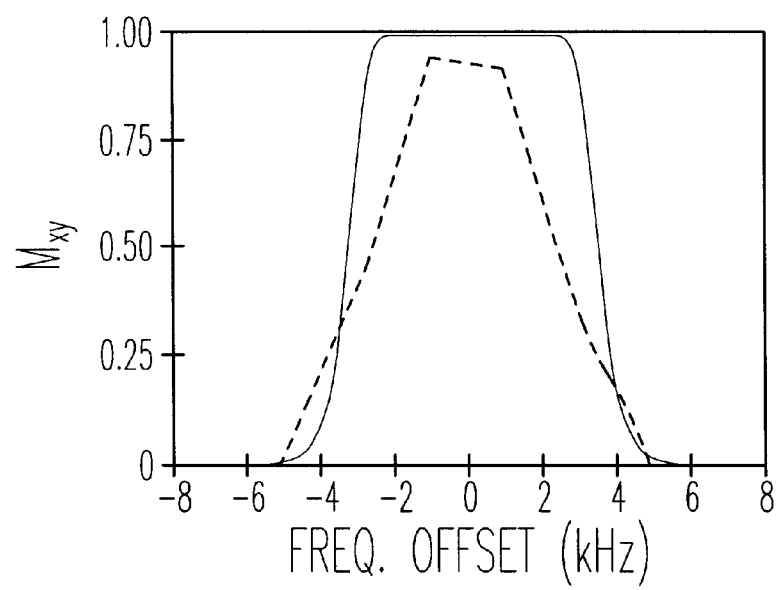
Figure 5C:
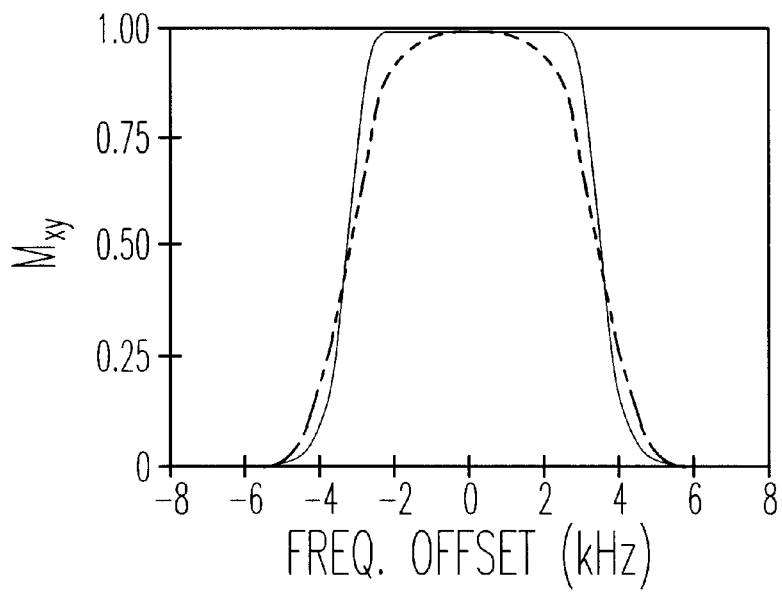
Figure 5D:
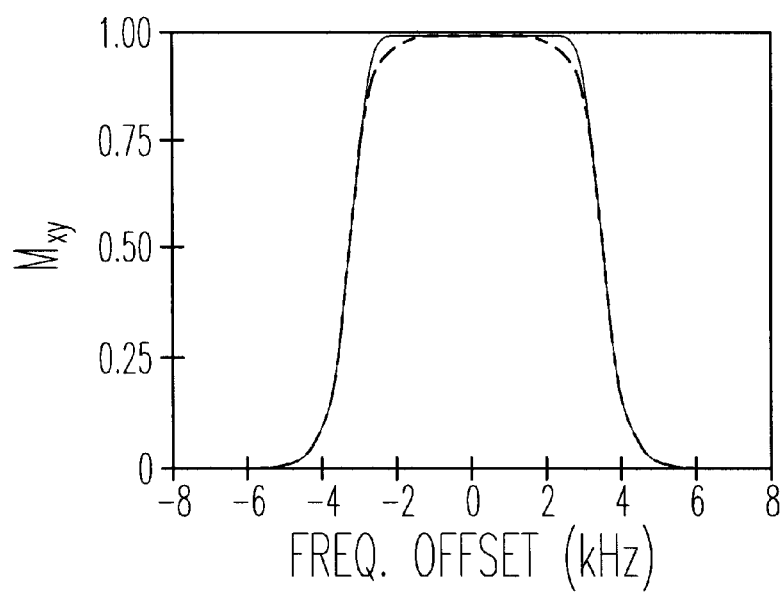
Figure 5E:
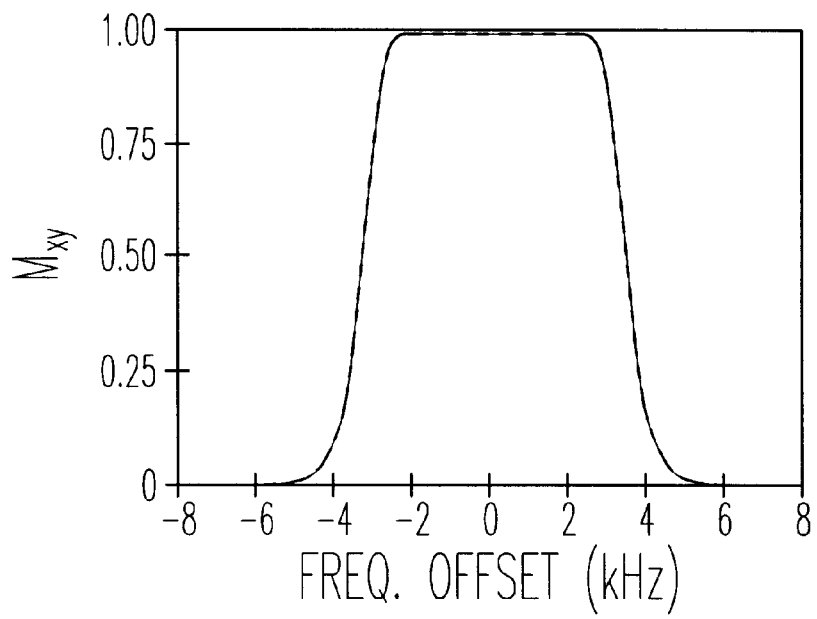
Figure 5F:
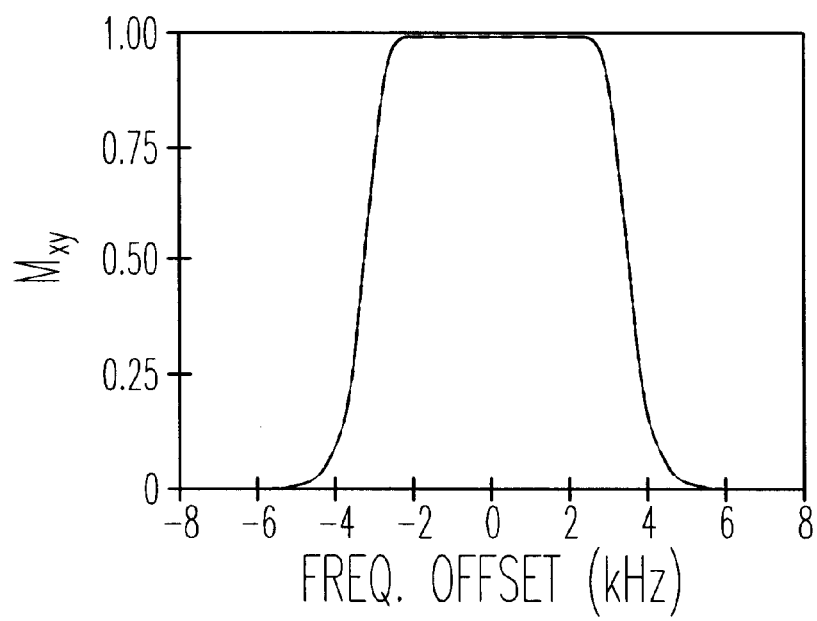
Figure 5G:
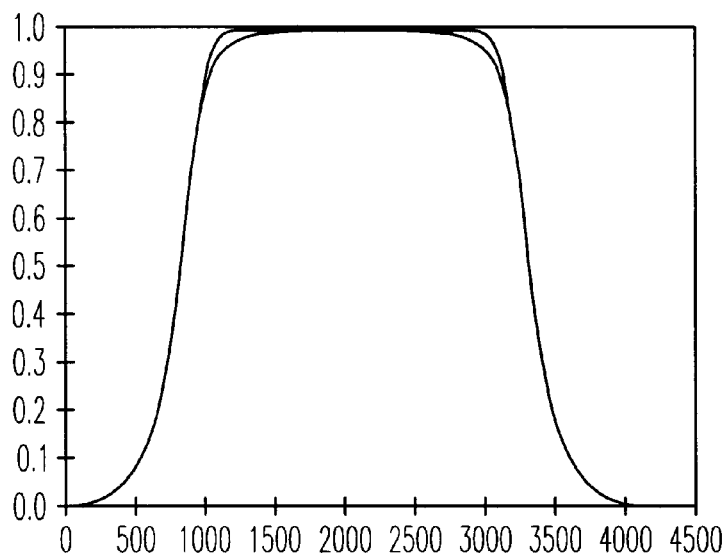
FIGS. 5G–5K are plots of simulated slab profiles for different adiabatic RF pulses, including an HS1 pulse (FIG. 5G), an HS2 pulse (FIG. 5H), an HS4 pulse (FIG. 5I), HS8 (FIG. 5J), and a chirp pulse (FIG. 5K), each having a temporal pulse width of 1 ms, 32 voxels, and R=15.
Figure 5H:
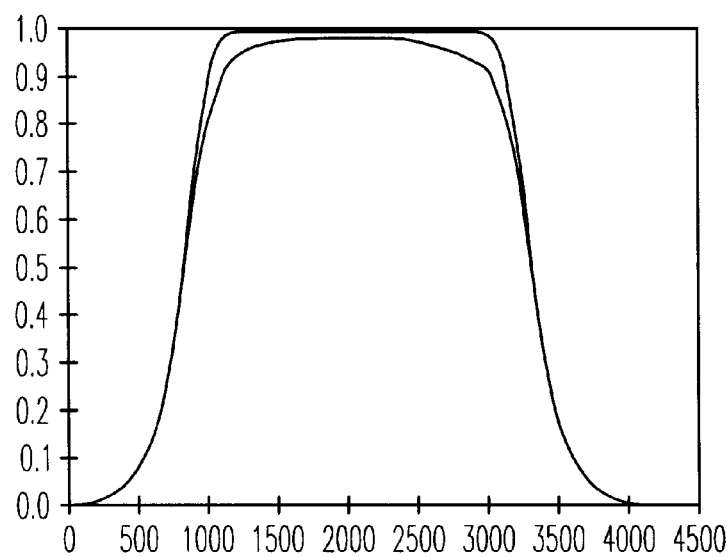
Figure 5I:
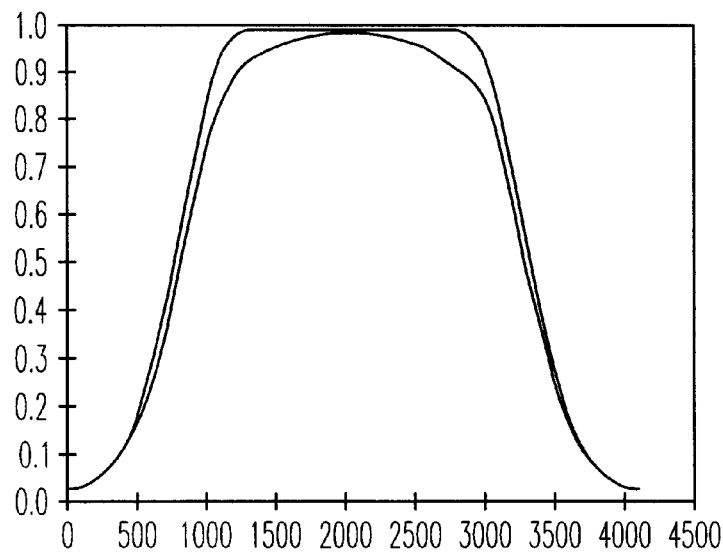
Figure 5J:
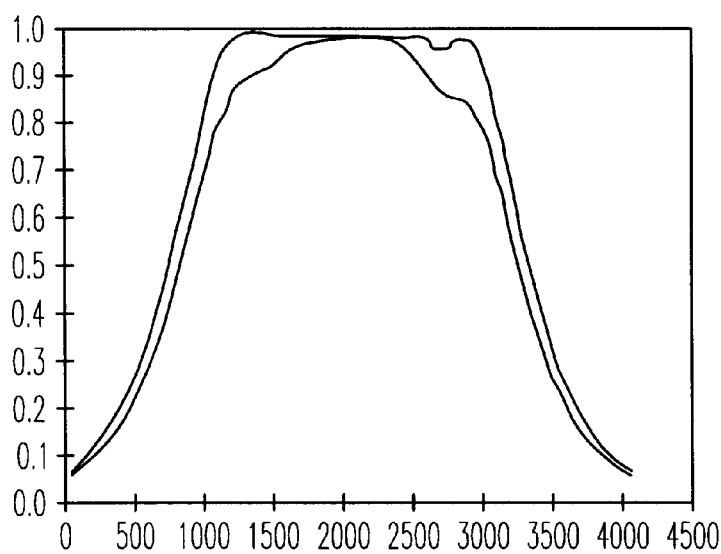
Figure 5K:
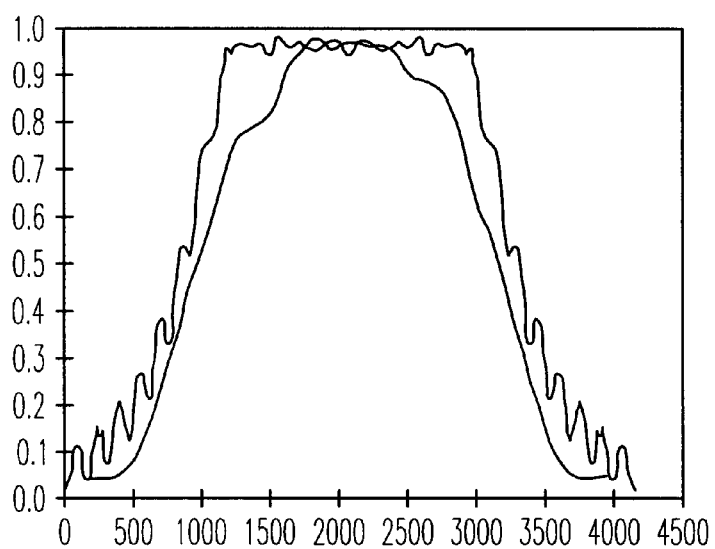

FIGS. 5G–5K are simulated slab profiles for the HSn RF excitation pulse for n=1, 2, 4 and 8 (FIGS. 5G–5J, respectively) and for a CHIRP pulse (FIG. 5K). It can be seen from the Figures that HSn pulses tend to provide the better slab profiles (FIGS. 5G–5J), while the resulting slab profile from the CHIRP pulse (FIG. 5K) is relatively poor. This simulation verifies the earlier observation that the CHIRP pulse would not be deemed a satisfactory RF excitation pulse for use in the present invention.

Methods of Operation

Figure 6:
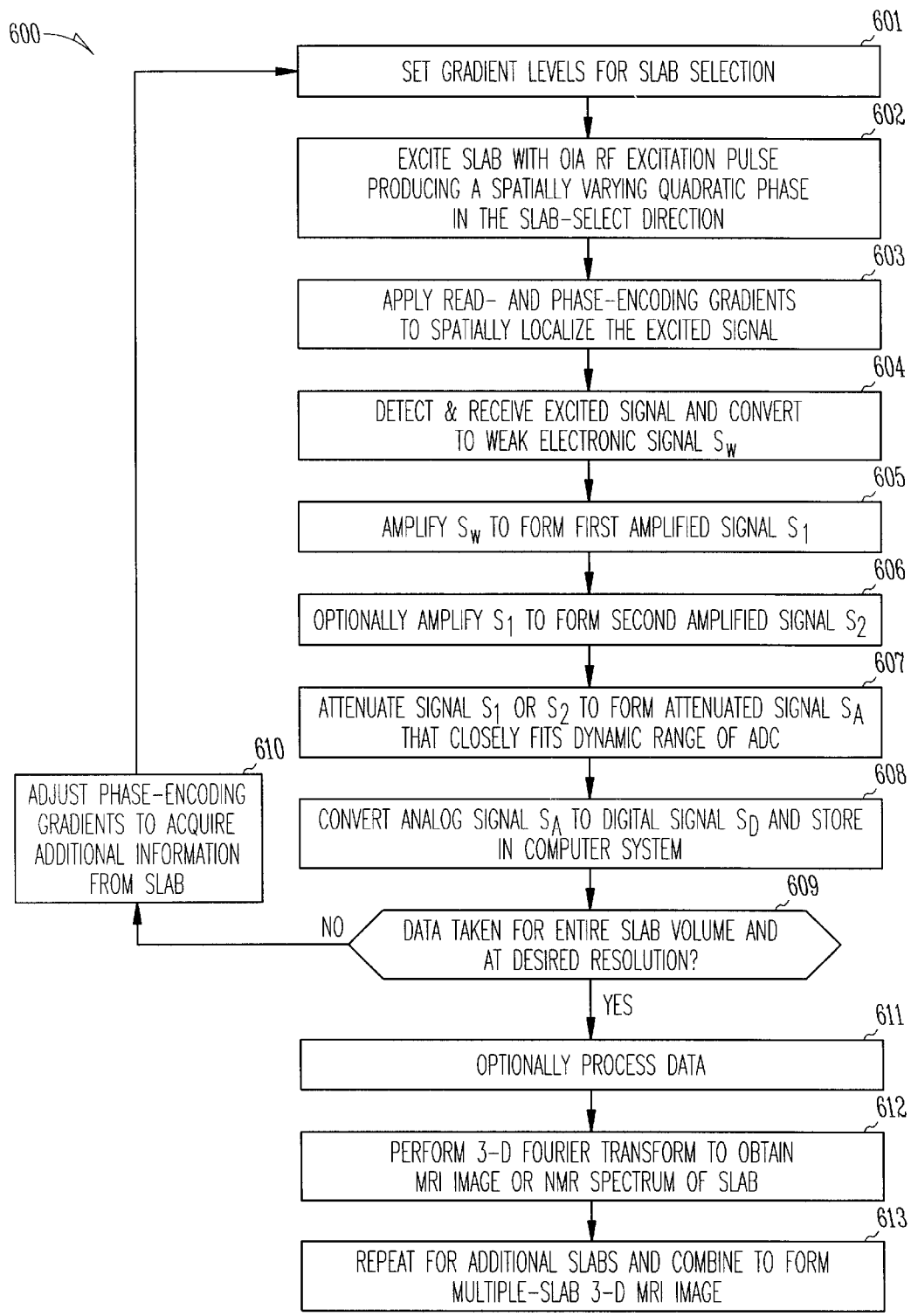
FIG. 6 is a flow diagram of a method of performing 3-D slab MRI or NMR spectroscopy according to the present invention using the system of FIG. 1.

With reference now to flow diagram 600 of FIG. 6 and also again to FIG. 1, exemplary embodiments for carrying out the methods of the present invention on system 10 are now described.

In 601, magnet 12 generates a static magnetic field $B_0$ (not shown) in the Z-direction. Gradient coil power source 30 drives gradient coils 16 to generate gradient magnetic fields (not shown) in open volume 15 in the X, Y and Z directions. The gradient magnetic fields serves as a slab-selection gradient field, a phase-encoding gradient field, and a readout gradient field. The slab-select direction can correspond to the any of the readout or phase-encode directions. In 601 the gradient magnetic fields are set as instructed by computer system 70.

In 602, computer 70 instructs RF amplifier 36, via an electronic signal, to provide an adiabatic RF excitation pulse via RF coil 20 to the select slab of sample 26 for excitation of the spins therein. The adiabatic RF excitation pulse is one that produces a sufficiently sharp slab profile, as discussed above. The adiabatic RF excitation pulse is typically on the order of a hundred watts or so, and a few milliseconds in duration. The adiabatic RF excitation pulse initiates rotation of the magnetization (i.e., excites the spins) in the slab, and produces a spatially varying substantially quadratic magnetization phase in the slab-select direction. This results in the generation of a weak electromagnetic signal 120 from the slab. The signal strength of signal 120 is typically on the order of microwatts.

Figure 7:
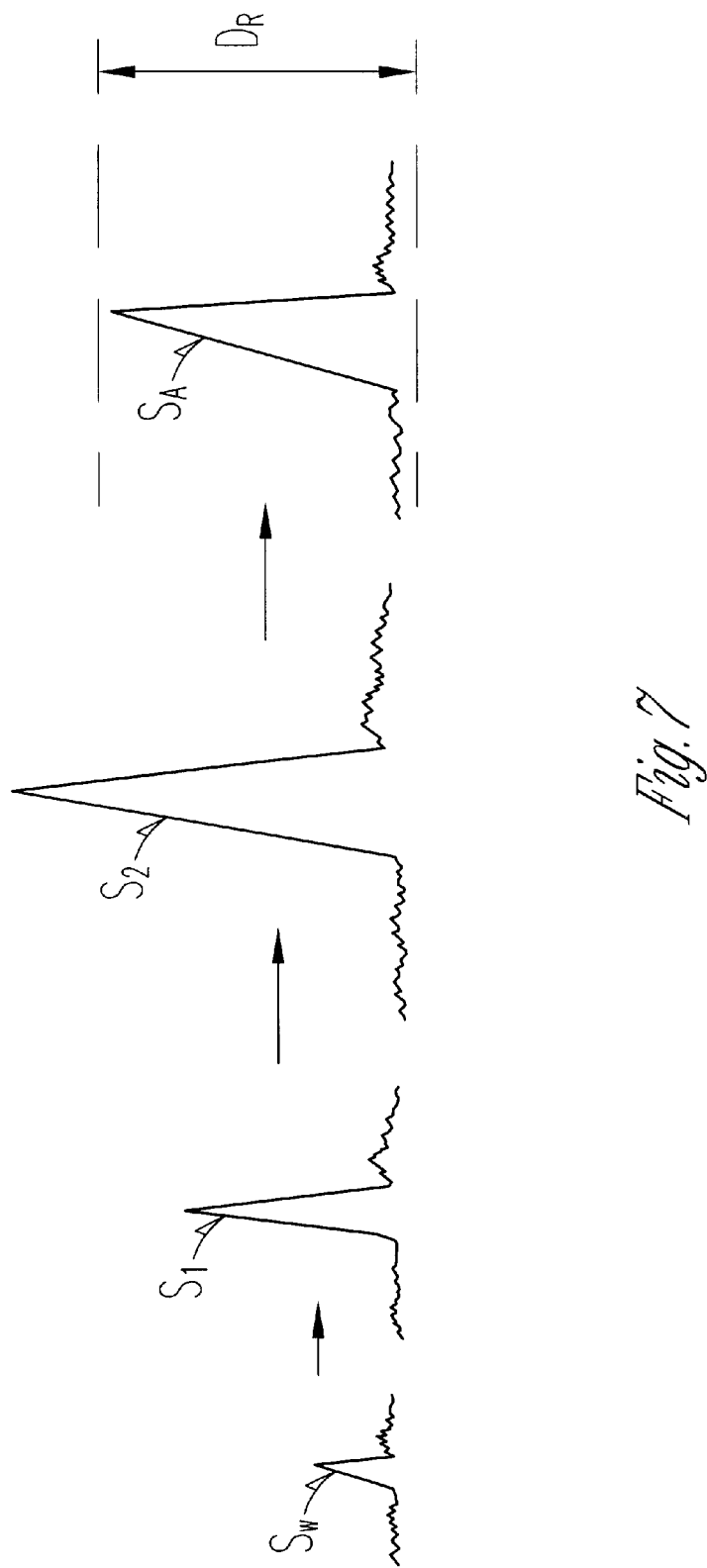
FIG. 7 are plots of the weak excited signal $S_W$, the first amplified signal $S_1$, the optional second amplified signal $S_2$, and the attenuated signal $S_A$ that is attenuated to closely fit the dynamic range (DR) of the ADC.

In 603, the read- and phase-encoding gradient fields are applied to spatially localize signal 120 within the slab. With reference also to FIG. 7, in 604, signal 120 is detected by RF coil 20, which converts the signal to a weak electrical signal $S_W$ (e.g., a voltage on the order of microvolts).

With continuing reference to FIG. 7, in 605, weak electrical signal $S_W$ is then amplified by first amplifier 50 to form a first amplified signal $S_1$. Amplification of weak electrical signal $S_W$ by amplifier 50 preferably introduces as little noise as possible. In an example embodiment of the present invention, in 606, first amplified electrical signal $S_1$ then passes out of Faraday cage 94 to second amplifier 52, which optionally amplifies signal $S_1$ to form a second amplified electrical signal $S_2$ that is generally on the order of the fixed dynamic range DR of ADC 66.

In 607, variable attenuator 60 attenuates electrical signal $S_1$ or $S_2$, if necessary, to form an attenuated electrical signal $S_A$ that it closely fits dynamic range DR. The attenuation of attenuator 60 is typically anywhere from 0 to 60 dB, with the convention being that 60 dB represents a signal that is not attenuated, while 0 dB represents a signal attenuated by 60 dB. By making electrical signal $S_A$ closely fit within dynamic range DR, the maximum signals are not truncated, while the lowest signals span the maximum number of discrete voltage steps. This prevents the lowest signals from being defined or otherwise limited by the quantization error introduced in the ADC. When properly digitized, any noise in the signal is properly attributed to mostly that of the weak electrical signal $S_W$ and hence the original electromagnetic signal from the sample.

In 608, ADC 66 converts the amplified and attenuated analog electrical signal $S_A$ to a digital electrical signal $S_D$, which is then passed to and stored in computer system 70 for further processing. The electrical signals described above, which end up in computer 70 as digital electrical signal $S_D$, represent the excited signal data for the corresponding slab $V_N$ of sample 26 (FIG. 4A).

In 609, the inquiry is made whether the excited signal data for the entire slab in sample 26 (i.e., for all the phase-encoding steps) has been taken. If the answer is "no," then the method proceeds to 610, in which computer 70 adjusts the levels of gradients used for phase-encoding in the next iteration. The method then returns to 601, and 601 through 608 are repeated (with 606 and 607 being optional) until excited signal data from the volume are obtained to reconstruct a MRI image or NMR spectrum with the desired resolution.

In 611, in an example embodiment of the present invention, the optional step of processing the excited signal data is performed. The processing might include weighting the data, filtering the data, or removing phase information from the data.

The method then proceeds to 612, in which the signals $S_D$ (i.e., the excited signal data) are processed and transformed (e.g., via Fourier-transformation) to obtain a 3-D MRI image or a NMR spectrum of the slab.

In another example embodiment of the present invention, in step 613, the above-described process is repeated for additional slabs and the slabs combined to form a multiple-slab 3D MRI image.

In another example embodiment of the present invention, computer system 70 is programmed with instructions (e.g., a computer program embodied in computer-readable medium 86 provided to computer system 70 and data storage unit 80, or via signal 90) to implement the above-described method of the present invention.

Experimental Results

To demonstrate the method of the present invention, a sample 26 in the form of a water phantom was positioned in system 10 outfitted with a 4 Tesla, 90 cm magnet (OMT) 12 and interfaced with a Varian $^{Unity}$INOVA® console having a computer system 70 and a display 72. Projections in the slab-select direction were acquired with a gradient-recalled echo. Two different RF excitation pulses were used: a "sinc" pulse, which is not an adiabatic pulse, and a hyperbolic secant (HS) pulse, which is an adiabatic pulse and is discussed above as an exemplary embodiment of an RF excitation pulse suitable for use in the present invention. Both pulses produced a 90° magnetization flip ($M_X$, $M_Y$) with a 3 ms pulse duration (Tp). The sinc pulse had two sidelobes on each side of the main lobe, and the HS pulse had a (BW)*(Tp) product (R) equal to 25. The slab thickness in sample 26 was 7 cm and the readout field-of-view (FOV) was 40 cm. The signal acquisition used 512 complex points. SNRs were calculated by comparing the maximum peak of the projection to the standard deviation of a region of white noise.

Figure 8:
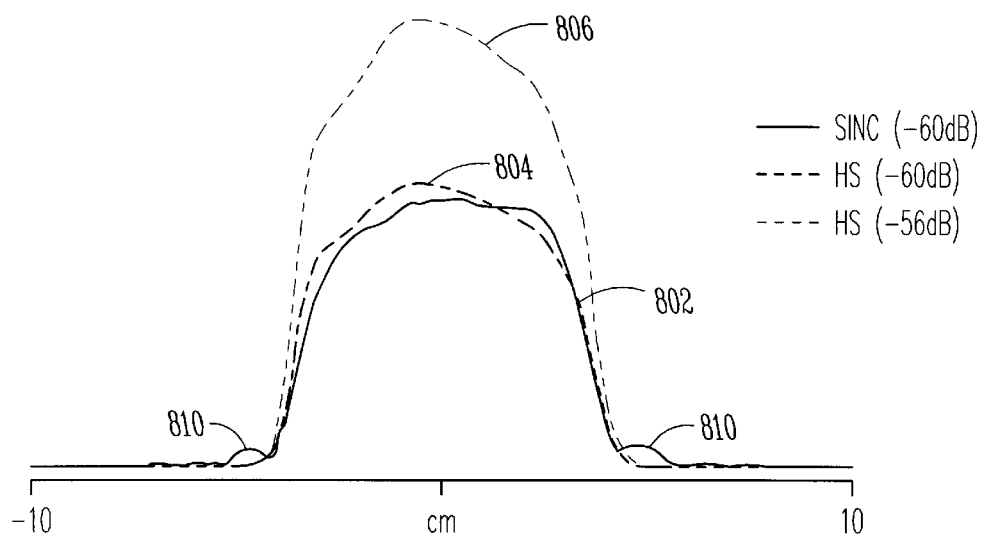
FIG. 8 are plots of the slab profiles for a sinc RF excitation pulse acquired with 60 dB attenuation compared with the slab profile of an HS RF excitation pulse with 60 dB and with 56 dB of attenuation.

With reference now to FIG. 8, the slab profile 802 generated by the sinc RF excitation pulse and slab profiles 804 and 806 generated by the HS RF excitation pulse are shown. The slab profile for the sinc pulse generates excitation side lobes 810, while the HS pulse does not.

Figure 9:
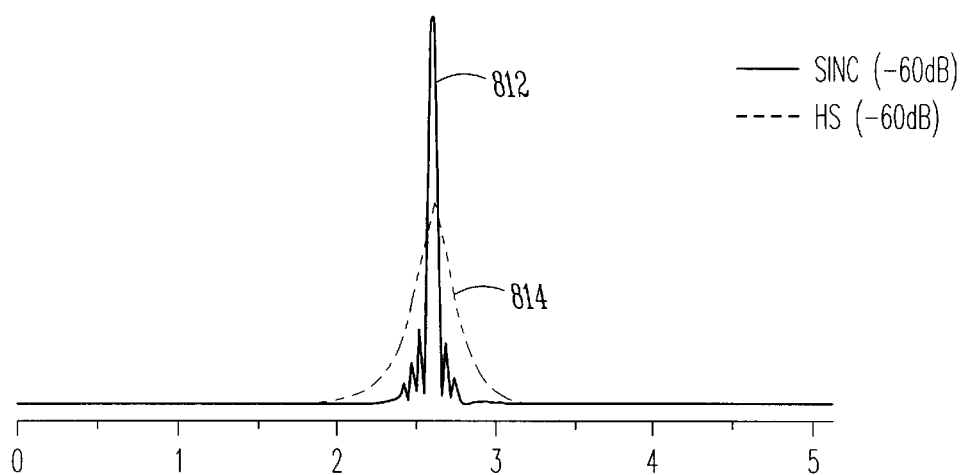
FIG. 9 are plots of the magnitude of the gradient-recalled echo signal associated with a sinc pulse and an HS pulse acquired with the same receiver gain, showing the lesser amplitude and broader spread for the HS pulse as compared to the sinc pulse.

FIG. 9 plots the absolute value of the acquired gradient echo signals 812 and 814 as a function of time for the sinc and HS pulses, respectively. When both the sinc and the HS RF excitation pulses are performed with the same amount of attenuation after preamplification (60 dB), the integrals of the echoes are equivalent. It can be seen in FIG. 9 that the HS RF excitation pulse distributes the signal over a broader period of time, therefore reducing the echo's peak amplitude. As apparent from FIG. 8, the slab profile 806 associated with the HS RF excitation pulse could be acquired with an attenuation of 56 dB, while slab profile 310 associated with the sinc RF excitation pulse completely fills the ADC with 60 dB of attenuation. With 60 dB of attenuation (ie, the maximum receiver gain for the sinc without overflowing the dynamic range DR of ADC 60), the sinc and HS RF excitation pulses yielded SNRs of 6900 and 7400, respectively. When the gain was adjusted so that the HS RF excitation pulse utilized the entire dynamic range of the ADC (56 dB attenuation), SNR was 8600. Thus, the HS RF excitation pulse provided an overall SNR improvement of 25%.

The absence of wobbles in slab profiles 804 and 806 associated with the ES RF excitation pulse (FIG. 8) opens the possibility of reducing the field of view (FOV) in the slab-select dimension, while still avoiding aliasing. Also, the stronger gradients that can be used with the larger bandwidth HS RF excitation pulse reduces out-of-slice excitation of chemically shifted resonances (eg, fat), again reducing the necessary FOV. By increasing the receiver gain, the magnitude of the quantization error is reduced in applications requiring the acquisition of high signal intensity (eg, 3D MRI), which improves SNR in certain dynamic-range-limited applications.

In the experimental results discussed above, 56% more signal averaging would be required with the sinc RF excitation pulse to reach the same SNR provided by the HS RF excitation pulse. Besides HS pulses, other adiabatic RF excitation pulses, such as the OIA pulses discussed above in connection with the Tannus and Garwood reference (and illustrated in FIGS. 3A, 3B) that produce a smooth non-linear phase variation and that result in a sharp slab profile, offer similar benefits in 3-D MRI imaging and NMR spectroscopy Conclusion The present invention improves the dynamic range of MRI and NMR spectroscopy through the use of adiabatic RF pulses as excitation pulses, rather than as inversion pulses. Suitable adiabatic RF pulses are those that produce a sharp slab profile. Use of such adiabatic pulses reduces the peak amplitude of the received signal from the sample, while at the same time spreading the signal out in time. Reducing the peak amplitude of the signal reduces the quantization error for low signals so that the quantization error is less than the noise in the returned (excited) signal. This improves the SNR, which results in improved MRI or an improved NMR spectrum. The method takes advantage of the substatially quadratic phase encoded into and thus generated by the adiabatic RF pulses, dividing up the quadratic phase variation into small voxels in the phase-encoding steps in the slab-select direction. This allows for each voxel to be locatable within the volume, and reduces the amount of dynamic range required of the ADC because of the reduced coherence between voxels. In addition, the slab profile is sharp, so that the location of the volume of interest for the 3-D image or NMR spectrum is sharply defined.

While the present invention has been described in connection with preferred embodiments, it will be understood that it is not so limited. On the contrary, it is intended to cover all alternatives, modifications and equivalents as may be included within the spirit and scope of the invention as defined in the appended claims.

What is claimed is:

1. A method of obtaining a magnetically resonant excited signal from a sample in a MRI or NMR system, comprising the steps of:

providing an adiabatic RF excitation pulse to the sample having a spatially varying frequency, the RF excitation pulse capable of generating a spatially sharp slab profile and producing a quadratic phase spatially across a slab of the sample; and detecting the excited signal emanating from the slab.

2. The method according to claim 1, wherein the adiabatic RF excitation pulse has a hyperbolic secant (HS) amplitude modulation.

3. The method according to claim 1, wherein the substantially quadratic phase is divided into a plurality of voxels by a phase-encoding or frequency-encoding gradient, wherein the phase variation across each voxel is negligible.

4. The method according to claim 1, wherein the adiabatic RF excitation pulse is an offset-independent adiabatic (OIA) pulse.

5. The method according to claim 1, including:
repeating the acts therein with different phase-encoding gradients to produce excited signal data until a desired resolution is obtained; and
transforming the excited signal data to obtain either a MRI image or a NMR spectrum of the slab.

6. The method according to claim 5, wherein the slab is divided into a plurality of voxels, and further including dividing up the substantially quadratic phase with the different phase encoding gradients so that the variation in phase across any one of the voxels is 180° or smaller.

7. The method according to claim 5, further including repeating the acts therein to form a plurality of MRI slab images and combining the slab images to form a multiple-slab 3-D MRI image.

8. The method according to claim 1, further including:
converting the excited signal into a weak electrical signal;
amplifying the weak electrical signal to form an amplified signal; and
attenuating the amplified signal so that it closely fits within a predetermined dynamic range.

9. The method according to claim 8, wherein amplifying the weak electrical signal involves a first amplification and a second amplification.

10. The method according to claim 8, further including;
forming a digital signal; and
passing the digital signal to a computer system.

11. The method according to claim 10, further including:
repeating the acts in claim 1 for different select portions of the slab until digitized excited signal data for the entire slab are obtained and stored in the computer system;
processing the digitized excited signal data; and
transforming the digitized excited signal data to either a MRI image of the slab or a NMR spectrum of the slab.

12. The method of claim 1, further including determining, through simulation or experiment, whether the adiabatic RF excitation pulse is capable of producing a sharp slab profile.

13. A computer-readable medium having computer-executable instructions to cause a computer to perform the method comprising:
providing an adiabatic magnetically resonant RF excitation pulse to a sample having a spatially varying frequency, the RF excitation pulse capable of generating a spatially sharp slab profile and producing a quadratic phase spatially across a slab of the sample; and
detecting the excited signal emanating from the slab.

14. A computer-readable medium according to claim 13 having computer-executable instructions to cause a computer to further perform the step of processing the excited signal.

15. The computer-readable medium according to claim 13, further including instructions to cause a computer to perform the acts of:
repeating the acts in claim 13 for different select portions of the slab until excited signal data from the entire slab is obtained; and
transforming the excited signal data to either a MRI image or a NMR spectrum of the slab.

16. A method of obtaining a magnetically resonant excited signal from a sample having a spatially varying frequency in a MRI or NMR system, comprising the steps of:
providing an adiabatic RF excitation pulse capable of producing a spatially varying phase that is substantially quadratic, and capable of producing a spatially sharp slab profile and an excited signal in a slab of the sample;
applying read- and phase-encoding gradients to the slab to spatially localize the excited signal; and
detecting the excited signal.

17. A method according to claim 16, wherein the adiabatic RF excitation pulse has a hyperbolic secant amplitude modulation.

18. A method according to claim 16, further including:
forming an electrical signal from the detected excited signal;
processing the electrical signal so that it closely fits a dynamic range associated with an analog-to-digital converter (ADC).

19. A method according to claim 18, wherein the processing of the electrical signal includes:
amplifying the signal one or more times; and
attenuating the signal.

20. A method according to claim 16, further including:
repeating the acts therein for different portions of the slab until excitation data for the entire slab are obtained; and
transforming the excitation data into either a MRI image of the slab or a NMR spectrum of the slab.

21. A method according to claim 16, wherein the excitation data are in the form of a plurality of digitized signals corresponding to respective phase-encoding steps that define a resolution of an image of the excited volume.

22. A computer-readable medium having computer-executable instructions to cause a computer to perform a method of obtaining a magnetically resonant excited signal from a sample having a spatially varying frequency in a MRI or NMR system, comprising the steps of:
providing an adiabatic RF excitation pulse capable of producing a spatially varying phase that is substantially quadratic and capable of producing a spatially sharp slab profile and an excited signal in a slab of the sample;
applying read- and phase-encoding gradients to the slab to spatially localize the excited signal; and
detecting the excited signal.

23. A computer-readable medium according to claim 22, further including instructions to cause a computer to perform the acts of:
forming an electrical signal from the excited signal; mid
processing the electrical signal so tat it closely fits a dynamic range associated with an analog-to-digital converter (ADC).

24. A computer-readable medium according to claim 22, further including instructions to cause a computer to perform the acts of:
repeating the acts therein for portions of the slab until excitation data for the entire slab are obtained; and
transforming the excitation data into either a MRI image or a NMR spectrum of the slab.

25. In a computer having a processor, a method of forming an MRI image or NMR spectrum of a slab of a sample having a spatially varying frequency arranged in a MRI or NMR system, the method comprising:

iteratively providing an adiabatic RF excitation pulse capable of forming a spatially sharp slab profile to the slab;

spatially varying the phase-encoding gradient levels in each iteration to localize excited signals in the slab;

detecting the excited signals; and in the processor, processing the excited signals to form the MRI image of the slab or the NMR spectrum of the slab.

26. The method of claim 25, wherein varying the phase-encoding gradient levels divides the phase of the excited signal into a plurality of voxels each having a phase variation that is sufficiently small.

27. A system which performs slab-select 3-D MRI or NMR spectroscopy of a slab in a sample having a spatially varying frequency, comprising:

means for inducing magnetically resonant excitation in the slab that creates a substantially quadratic phase spatially across the slab arid that creates a spatially sharp slab profile;

means for detecting excited signals from the magnetically resonant excitation; and means for processing the excited signals to form a MRI image of the slab or a NMR spectrum of the slab.

28. A system which performs 3-D MRI or NMR spectroscopy of a slab of a sample having a spatially varying frequency, comprising:

a magnet that creates a constant magnetic field within the slab;

gradient coils capable of forming phase-encoding gradient magnetic fields within the slab; and one or more RF coils in operable communication with the slab and capable of providing thereto adiabatic RF excitation pulses capable of forming a spatially sharp slab profile and a substantially quadratic phase spatially across the slab, and detecting an excited signal from the slab.

29. A system according to claim 28, further including:

an analog-to-digital converter having a bandwidth and electrically connected to the one or more RF coils; and a computer system electrically connected to the ADC for receiving digitized signals therefrom and processing the digitized signals to form a MRI image of the slab or a MAR spectrum of the slab.

30. A system according to claim 28, further including:

one or more amplifiers electrically connected to the one or more RF coils for amplifying the first electrical signal; and a variable attenuator electrically connected to the one or more amplifiers for attenuating the amplified first electrical signal to fit into a predetermined dynamic range.

* * * * *

UNITED STATES PATENT AND TRADEMARK OFFICE
CERTIFICATE OF CORRECTION

PATENT NO. : 6,650,116 B2
DATED : November 18, 2003
INVENTOR(S) : Garwood et al.

It is certified that error appears in the above-identified patent and that said Letters Patent is hereby corrected as shown below:

<u>Column 7</u>,
Line 37, delete "ITS" and insert -- HS --, therefor.
Line 48, delete "resent" and insert -- present --, therefor.

<u>Column 10</u>,
Line 2, delete "ES" and insert -- HS --, therefor.

<u>Column 12</u>,
Line 53, delete "mid" and insert -- and --, therefor.
Line 54, delete "tat" and insert -- that --, therefor.

<u>Column 14</u>,
Line 19, delete "MAR" and insert -- NMR --, therefor.

Signed and Sealed this

Twentieth Day of January, 2004

JON W. DUDAS
*Acting Director of the United States Patent and Trademark Office*